United States Patent
Meier

[11] Patent Number: 6,101,517
[45] Date of Patent: Aug. 8, 2000

[54] CIRCUIT AND METHOD FOR THE MULTIPLE USE OF A DIGITAL TRANSVERSAL FILTER

[75] Inventor: Stefan Meier, München, Germany

[73] Assignee: Siemens Aktiengesellschaft, Munich, Germany

[21] Appl. No.: 09/068,431

[22] PCT Filed: Oct. 1, 1996

[86] PCT No.: PCT/DE96/01883

§ 371 Date: May 8, 1998

§ 102(e) Date: May 8, 1998

[87] PCT Pub. No.: WO97/17758

PCT Pub. Date: May 15, 1997

[30] Foreign Application Priority Data

Nov. 9, 1995 [DE] Germany ............... 195 41 853

[51] Int. Cl.[7] .................................................. G06F 17/10
[52] U.S. Cl. .................................................... 708/319
[58] Field of Search ............................. 708/319, 301, 708/322

[56] References Cited

U.S. PATENT DOCUMENTS 5,381,357  1/1995  Wedgwood et al. ............... 708/319
5,790,439  8/1998  Yamanaka et al. ............... 708/319
5,831,879  11/1998  Yom et al. ...................... 708/319

FOREIGN PATENT DOCUMENTS 0 500 394 A2  8/1992  European Pat. Off. .

OTHER PUBLICATIONS

Digital Signal Processing, by Alan V. Oppenheim et al., pp. 148–153.
Videocodec—Vollstandig digital pp. 54–62, Elektronik Sep. 1991.
Carry Save Architectures for High–Speed Digital Signal Processing, by Tobias G. Noll, pp. 121–140, J. of VLSI Signal Processing, 1991.
Adaptive Equalization, Shahid Qureshi, pp. 1349–1387, Proceedings of the IEEE, vol. 73, No. 9 Sep. 1985.
High Speed FIR Filter Architectures with Scalable Sample Rates, by Martin Vaupel et al., pp. 127–130.
Digitale Filter fur Videosignale p. 69, Design & Elektronik 9 vom Apr. 23, 1991.

*Primary Examiner*—David H. Malzahn
*Attorney, Agent, or Firm*—Hill & Simpson

[57] ABSTRACT

Circuit and method for the multiple use of a digital transversal filter wherein a coefficient block of n coefficients, there is, in each case, provision of 2 multiplier units which are subject to multiple use if the internal clock of the filter is greater, than an order of magnitude, than an external clock which is required by the filter.

16 Claims, 11 Drawing Sheets

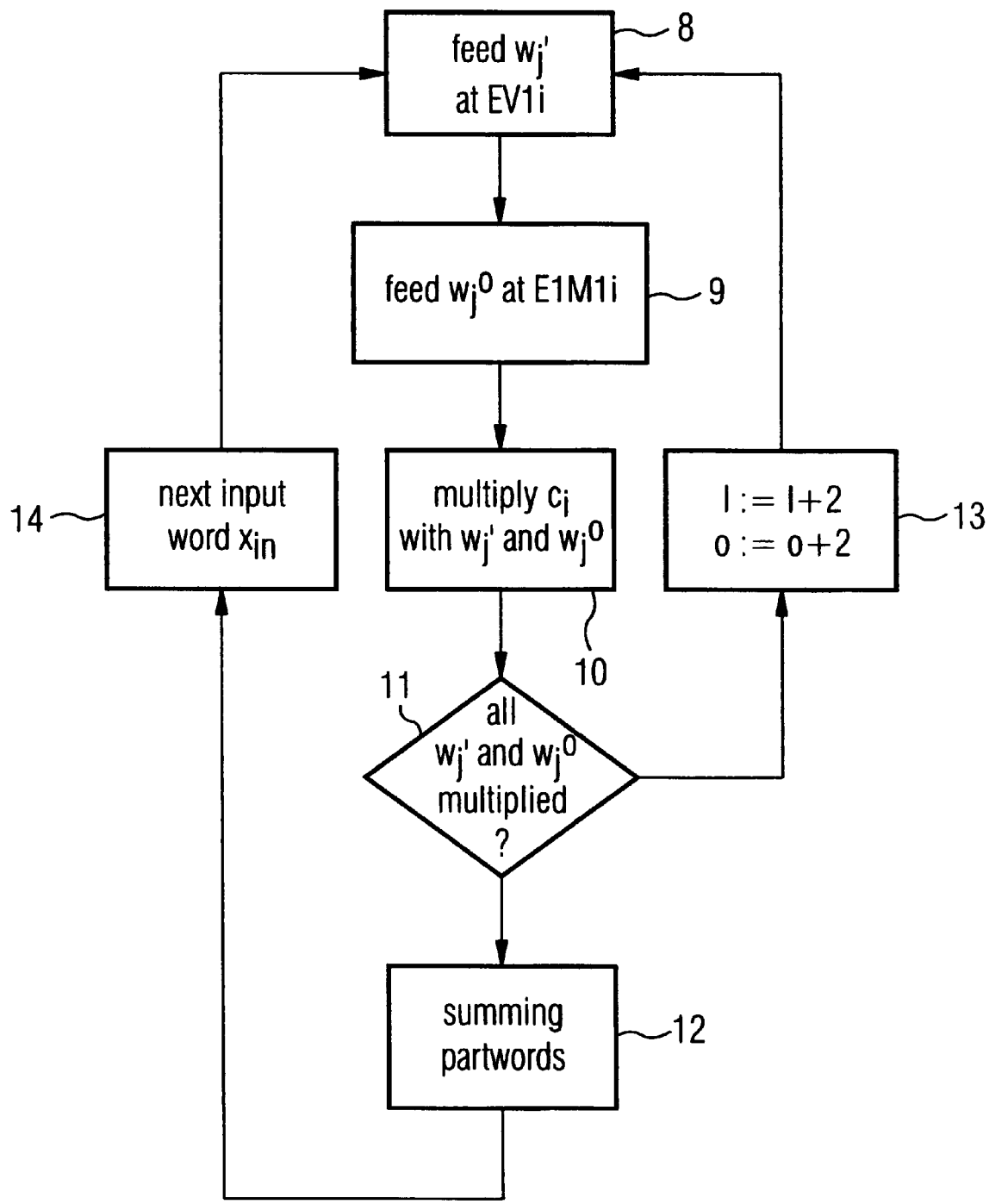

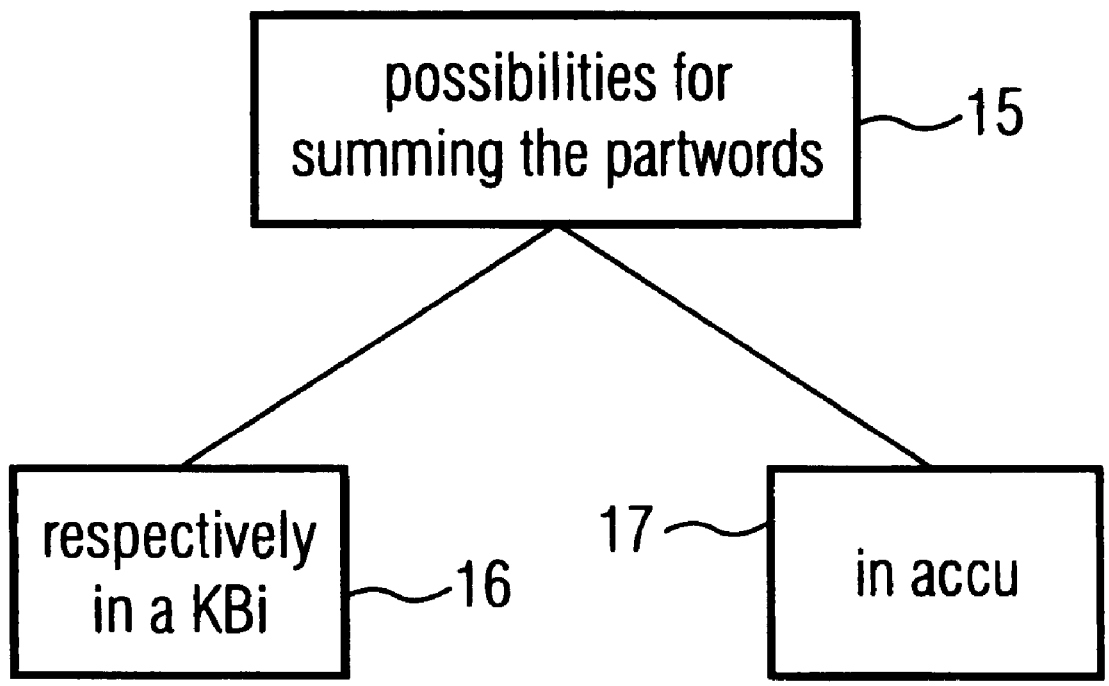

CIRCUIT AND METHOD FOR THE MULTIPLE USE OF A DIGITAL TRANSVERSAL FILTER

BACKGROUND OF THE INVENTION

1. Field of the Invention

The present invention is directed to a circuit and method for the multiple use of a digital transversal filter wherein, in a coefficient block having n coefficients, two multiplier units are provided which are subject to multiple use if an internal clock of the filter is faster, by an integral order of magnitude, than an external clock which is required by the filter.

2. Description of the Prior Art

Bit plane and modified bit plane architectures are often used for the highly efficient implementation of digital transversal filters. If the necessary external data rate (sampling rate) at which a filter function is to be carried out is significantly below the internal data rate with which filter switching operations can be implemented using modern switching technologies, a reduction in the chip area for a given throughput rate of the transversal filter can be achieved through the multiple use of the transversal filter.

During multiple use of the transversal filter, a plurality of arithmetic substeps are successively carried out at a plurality of internal clock pulses during one external clock pulse in an arithmetic unit. In such a case, it is necessary to ensure, in particular, that the additional expenditure on the sequential feeding of the operands for the arithmetic substeps as well as the storage of intermediate results is not too large.

Bases for the implementation of digital transversal filters in bit plane and modified bit plane architectures are known and described in T. Noll, Carry-Save Architectures for High-Speed Digital Signal Processing, Journal of the VLSI Signal Processing, Vol. 3, Kluwer Academic Publishers, Boston, pp. 121–140, 1991).

In circuit arrangements in which the necessary external data rate at which a transversal filter function is to be carried out is higher than the internal data rate with which transversal filter switching operations can be implemented, it is possible to use linearly scaling parallelization concepts which are known (U. Seuben et al, Digitale Filter für Videosignale, Design und Elektronik [digital filters for video signals, design and electronics], No. 9, page 69, 1991).

The connecting together of a plurality of component filters to form one complex-valued filter is described, for example, in S. Quereshi, Adaptive Equalization, Proc. of the IEEE, Vol. 73, No. 9, pp. 1349 to 1387, 1985). M. Vaopel and H. Meyr, High Speed FIR Filter Architectures with Scalable Rates, Internat. Symposium on Circuits and System (ISCAS) VLSI, London, May 40–June 2, Vol. 4, May 30, 1994 discloses principles of high-speed FIR filter architectures (FIR=Finite Impulse Response).

SUMMARY OF THE INVENTION

The present invention is directed toward a circuit and method which permit the multiple use of a digital transversal filter.

The circuit permits multiple use of a digital transversal filter if the internal data rate of the digital filter is an integral order of magnitude higher than the necessary external data rate with which the digital transversal filter must "filter" data.

As a result of the fact that in each case two multiplier units are provided for the multiplication of a coefficient by an input data word, and a plurality of coefficient bits are multiplied by the respectively present input data word, in each case at an external clock, in the multiplier cells, a reduction in the necessary chip area is achieved when the digital transversal filter is implemented.

Accordingly, in an embodiment of the present invention, a circuit of a digital filter is provided which includes a circuit input to which an input word can be fed; n coefficient blocks wherein each coefficient block further includes a first multiplier unit, a second multiplier unit, a first adder unit wherein a first input of the first adder unit is connected to an output of the first multiplier unit, a second adder unit wherein a first input of the second adder unit is connected to an output of the second multiplier unit, a first delay unit wherein an input of the first delay unit is connected to a first input of the first multiplier unit and an output of the first delay unit is connected to a first input of the second multiplier unit, a second delay unit wherein an input of the second delay unit is connected to an output of the first adder unit and an output of the second delay unit is connected to a second input of the second adder unit, a third delay unit wherein an input of the third delay unit is connected to an output of the second adder unit and an output of the third delay unit is connected to a second input of a first adder unit of a following coefficient block, a second input of the first multiplier unit to which a coefficient bit with even-numbered significance is applied, and a register unit wherein an input of the register unit is connected to an output of a register unit of a following coefficient block and an output of the register unit connected to the first input of the first multiplier unit; an accumulator register wherein an input of the accumulator register is connected to the output of the third delay unit of the n'th coefficient block; and a circuit output coupled to the accumulator register and from an output word can be tapped.

In an embodiment, the register unit includes a register which is reloaded after a number of internal clock pulses corresponding to half a coefficient word length.

In an embodiment, the register unit includes a plurality of registers numbering one fewer than half a coefficient word length wherein each of the plurality of registers is reloaded after each internal clock pulse.

In an embodiment, the input of the first delay unit is connected to the first input of the first multiplier unit of a first coefficient block, and the output of the first delay unit is connected to all first inputs of all second multiplier units.

In an embodiment, the filter is an interpolation filter.

In an embodiment, the filter is a decimating filter.

In an embodiment, the first is a complex-valued filter.

In another embodiment of the present invention, a circuit of a digital filter is provided which includes a circuit input to which an input word can be fed; n coefficient blocks wherein each coefficient block further includes a first multiplier unit, a second multiplier unit, a first adder unit wherein a first input of the first adder unit is connected to an output of the first multiplier unit, a second adder unit wherein a first input of the second adder unit is connected to an output of the second multiplier unit, a second delay unit wherein an input of the second delay unit is connected to an output of the first adder unit and an output of the second delay unit is connected to a second input of the second adder unit, a third delay unit wherein an input of the third delay unit is connected to an output of the second adder unit and an output of the third delay unit is connected to a second input of a first adder unit of a following coefficient block, a second input of the first multiplier unit to which a coefficient bit with even-numbered significance is applied, and a second input of the second multiplier unit to which a coefficient bit with odd-numbered significance is applied; a switch unit having two switch positions, the second input of the first adder unit is connected to the output of the third delay unit of a preceding coefficient block in a first switch position, and wherein a second input of the first adder unit is connected to the output of the third delay unit in a second switch position; a first delay unit, an input of the first delay unit is connected to a first input of the first multiplier unit of a first coefficient block, and an output of the first delay unit is connected to all first inputs of all second multiplier units; and a circuit output coupled to the accumulator register and from an output word can be tapped.

In a further embodiment of the present invention, a circuit of a digital filter is provided which includes a circuit input to which an input word can be fed; n coefficient blocks wherein each coefficient block further includes a first multiplier unit, a second multiplier unit, a first adder unit wherein a first input of the first adder unit is connected to an output of the first multiplier unit, a second adder unit wherein a first input of the second adder unit is connected to an output of the second multiplier unit, a first delay unit wherein an input of the first delay unit is connected to a first input of the first multiplier unit and an output of the first delay unit is connected to a first input of the second multiplier unit, a second delay unit wherein an input of the second delay unit is connected to an output of the first adder unit and an output of the second delay unit is connected to a second input of the second adder unit, a third delay unit wherein an input of the third delay unit is connected to an output of the second adder unit and an output of the third delay unit is connected to a second input of a first adder unit of a following coefficient block, a second input of the second multiplier unit to which a coefficient bit with odd-numbered significance is applied, a first register unit wherein an input of the first register unit is connected to an output of a first register unit of a following coefficient block, and a second register unit wherein an input of the second register unit is connected to an output of a second register unit of a following coefficient block and an output of the second register unit is connected to a first input of the first multiplier unit; an accumulator register wherein an input of the accumulator register is connected to the output of the third delay unit of the n'th coefficient block; and a circuit output coupled to the accumulator register and from which an output word can be tapped.

In an embodiment, both the first register unit and the second register unit have a word length of one and a length of $$\frac{w_m}{2} - 1$$

In an embodiment, the first register unit and the second register unit have a word length of one and a length of $w_m-1$.

In yet another embodiment of the present invention, a method is provided for the multiple use of a digital filter having a plurality of coefficient blocks, wherein the method includes the steps of: providing the filter with an external block; providing the filter with an internal block which is an integral order of magnitude faster than the external clock; providing, in each coefficient block, a first multiplier unit; providing, in each coefficient block, a second multiplier unit; providing, in each coefficient block, a first adder unit wherein a first input of the first adder unit is connected to an output of the first multiplier unit; providing, in each coefficient block, a second adder unit wherein a first input of the second adder unit is connected to an output of the second multiplier unit; providing, in each coefficient block, a first delay unit wherein an input of the first delay unit is connected to a first input of the first multiplier unit and an output of the first delay unit is connected to a first input of the second multiplier unit; providing, in each coefficient block, a second delay unit wherein an input of the second delay unit is connected to an output of the first adder unit and an output of the second delay unit is connected to a second input of the second adder unit; providing, in each coefficient block, a third delay unit wherein an input of the third delay unit is connected to an output of the second adder unit and an output of the third delay unit is connected to a second input of a first adder unit of a following coefficient block; providing, in each coefficient block, a second input of the first multiplier unit to which a coefficient bit with even-numbered significance is applied; providing, in each coefficient block, a second input of the second multiplier unit to which a coefficient bit with odd-numbered significance is applied; providing, in each coefficient block, a register unit wherein an input of the register unit is connected to an output of a register unit of a following coefficient block and an output of the register unit is connected to the first input of the first multiplier unit; providing an accumulator register wherein an input of the accumulator register is connected to the output of the third delay unit of the n'th coefficient block; providing a circuit output coupled to the accumulator register and from which an output word can be tapped; applying, in each coefficient block, a coefficient bit with even-numbered significance in a chronological succession for a duration of one internal clock pulse to the second input of the first multiplier unit; applying, in each coefficient block, a coefficient bit with odd-numbered significance in a chronological succession for the duration of one internal clock pulse and delayed by half an internal clock pulse with respect to the application of the coefficient bit with even-numbered significance to the second input of the second multiple unit; multiplying an applied input word by the applied coefficient bits in the first multiplier unit and in the second multiplier unit; and summing partwords which have been produced as a result of the multiplications in accordance with the significance to form a composite word.

In an embodiment, the summing of the partwords is carried out individually for each coefficient in each coefficient block.

In an embodiment, the summing of all partwords of all coefficients is carried out in an accumulator register.

In an embodiment, the method further includes the step of applying coefficients of a plurality of filter functions to the first and second multiplier units in alternating succession.

In yet a further embodiment of the present invention, a method is provided for the multiple use of a digital filter having a plurality of coefficient blocks, wherein the method includes the steps of: providing the filter with an external clock; providing the filter with an internal clock which is an integral order of magnitude faster than the external clock; providing, in each coefficient block, a first multiplier unit; providing, in each coefficient block, a second multiplier unit; providing, in each coefficient block, a first adder unit wherein a first input of the first adder unit is connected to an output of the first multiplier unit; providing, in each coefficient block, a second adder unit wherein a first input of the second adder unit is connected to an output of the second multiplier unit; providing, in each coefficient block, a first delay unit wherein an input of the first delay unit is connected to a first input of the first multiplier unit and an output of the first delay unit is connected to a first input of the second multiplier unit; providing, in each coefficient block, a second delay unit wherein an input of the second delay unit is connected to an output of the first adder unit and wherein an output of the second delay unit is connected to a second input of the second adder unit; providing, in each coefficient block, a third delay unit wherein an input of the third delay unit is connected to an output of the second adder unit and an output of the third delay unit is connected to a second input of a first adder unit of a following coefficient block; providing, in each coefficient block, a second input of the first multiplier to which a coefficient bit with even-numbered significance is applied; providing, in each coefficient block, a second input of the second multiplier unit to which a coefficient bit with odd-numbered significance is applied; providing, in each coefficient block, a register unit wherein an input of the register unit is connected to an output of a register unit of a following coefficient block and an output of the register unit is connected to the first input of the first multiplier unit; providing an accumulator register wherein an input of the accumulator register is connected to the output of the third delay unit of the n'th coefficient block; providing a circuit output coupled to the accumulator register and from an output word can be tapped; applying, in each coefficient block, an input word bit with even-numbered significance in a chronological succession for a duration of one internal clock pulse to the input of the first delay unit; applying, in each coefficient block, an input word bit with odd-numbered significance in a chronological succession for the duration of one internal clock pulse to the first input of the first multiplier unit; multiplying the coefficient word which is applied to the first input of the first multiplier cell by the coefficient word which is applied to the first input of the second multiplier cell; and summing partwords which have been produced as a result of the multiplications in accordance with the significance in an accumulator register to form a composite word.

Additional features and advantages of the present invention are described in, and will be apparent from, the Detailed Description of the Preferred Embodiments and from the Drawings.

DESCRIPTION OF THE DRAWINGS

FIG. 12 shows a flowchart which describes the method steps for the multiple use of a digital transversal filter in input word length.

FIG. 13 shows an outline in which various ways of summation during the multiple use of a digital transversal filter in the direction of the coefficient word length are illustrated.

DETAILED DESCRIPTION OF THE PREFERRED EMBODIMENTS

Figure 1:
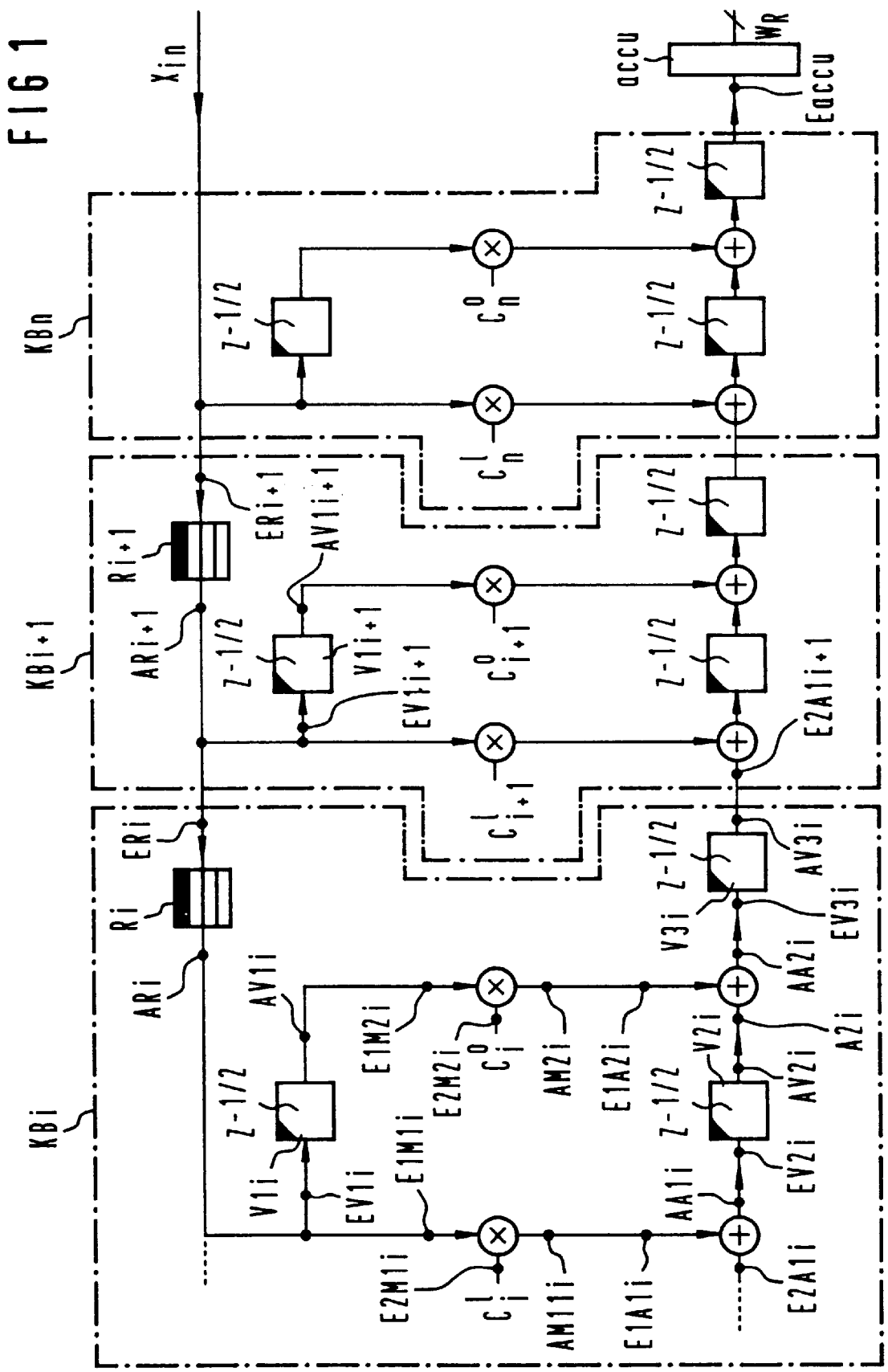
FIG. 1 shows a detail of a circuit of a digital transversal filter with three taps wherein the filter is employed for multiple use in the direction of the coefficient word length.

FIG. 1 shows a circuit of a first exemplary embodiment of a digital transversal filter F. Although this figure illustrates only a detail of three taps of a digital transversal filter F, the circuit of the present invention should not be so restricted. Indeed, such circuit can be expanded as is readily apparent to any person skilled in the art, to a digital transversal filter with n coefficients, wherein n is any desired natural number.

Below, the term "the filter element" designates the circuit of the filter which can be used to implement filter circuits, and the term "the filter" designates the transmission function for the description of the filter structure. The digital transversal filter F, which is implemented for n coefficients and in FIG. 1 the number of coefficients, is therefore n=3, is divided into n coefficient blocks KBi. The index i designates each coefficient block KBi uniquely. It is a natural number in the range from 1 to n.

Each coefficient block KBi has at least the following components:

a first multiplier unit $M1i$, a second multiplier unit $M2i$, a first adder unit $A1i$, a second adder unit $A2i$, a first delay unit $V1i$, a second delay unit $V2i$, a third delay unit $V3i$, and a register unit $Ri$.

In addition, the circuit arrangement of the digital transversal filter F also has an accumulator register accu.

In the first exemplary embodiment as shown in FIG. 1, each coefficient block KBi is of the following design. The first adder unit $A1i$ is connected via a first input $E1A1i$ of the first adder unit $A1i$ to an output $AM1i$ of the first multiplier unit $M1i$. Furthermore, the second adder unit $A2i$ is connected by means of a first input $E1A2i$ to an output $AM2i$ of the second multiplier unit $M2i$. The first delay unit $V1i$ is connected by means of its input $EV1i$ to a first input $E1M1i$ of the first multiplier unit $M1i$. An output $AV1i$ of the first delay unit $V1i$ is connected to a first input $E1M2i$ of the second multiplier unit $M2i$. The second delay unit $V2i$ is connected by means of its input $EV2i$ to an output $AA1i$ of the first adder unit $A1i$ and by means of its output $AV2i$ to a second input $E2A2i$ of the second adder unit $A2i$.

Coefficient bits $c_1^1$ are applied in succession, in a way described below, to a second input E2M1$i$ of the first multiplier unit M1$i$. Here, as above, the index i designates the coefficient for which the respective coefficient block KB$i$ is provided.

There is a further index 1 which is a natural even number; that is, it lies in the range $0, 2, 4, 6, \ldots, w_k-2$, where $w_k-2$ is a coefficient word length wk indicating the length of the respective coefficient word $c_i$ in binary notation. The individual coefficient bits $c_1^1$ are therefore applied with the significances $2^0, 2^2, 2^4, 2^6, \ldots, 2^{wk-2}$ in succession to the second input E2M1$i$ of the first multiplier unit M1$i$.

Coefficient bits $c_1^0$ with odd-numbered significances are applied to a second input E2M2$i$ of the second multiplier unit M2$i$. The index 0 is an odd-numbered natural number; that is, it is a number from $1, 3, 5, 7, \ldots, w_k-1$. The coefficient bits c are therefore applied with the significances $2^1, 2^3, 2^5, 2^7, \ldots, 2^{wk-1}$ in succession to the second input E2M2$i$ of the second multiplier unit M2$i$.

Furthermore, each coefficient block KB$i$ has a register unit R$i$ which is connected via its output AR$i$ to the first input E1M1$i$ of the first multiplier unit M1$i$ and to the input EV1$i$ of the first delay unit V1$i$. The individual coefficient blocks KB$i$ are connected to one another in such a way that, in each case, an input ER$i$ of the register unit R$i$ of the i-th coefficient block KB$i$ is connected to an output AR$i+1$ of a register unit R$i+1$ of a following coefficient block KB$i+1$. In addition, an output AV3$i$ of the third delay unit V3$i$ is connected to a second input E2A1$i+1$ of a first adder unit A1$i+1$ of the following coefficient block KB$i+1$. Each of the n coefficient blocks KB$i$ has the same design as described above and is coupled, also as described above, to the respective neighboring coefficient blocks.

In addition, the accumulator register accu, whose input Eaccu is connected to an output AV3$n$ of a third delay unit V3$n$, is provided in the n-th coefficient block KB$n$. In the accumulator register accu, all the partwords which are "passed on" in each case by the coefficient blocks KB$i$, as described below, are summed in accordance with the known significance of the individual partwords.

It is assumed that the digital transversal filter carries out F $w_{k/2}$ internal cycles per external clock pulse. Hence, the digital transversal filter F has a data rate which is $w_{k/2}$ times lower than is actually "required" by the digital transversal filter F.

In one variant of the circuit arrangement according to the present invention, the register unit R$i$ of each coefficient block KB$i$ has a register, and in a further variant it has $w_{k/2}-1$ registers. The different number of registers which the register unit R$i$ affects the different residence time of the respective input data words $x_{in}$ by which the individual coefficient bits of the respective coefficients $c_i$ are multiplied.

This means that if the register unit R$i$ has precisely one register, this register, which in each case stores precisely the input data word $x_{in}$, is loaded with a new input data word $x'_{in}$ after $w_{k/2}$ internal clock pulses. This means that, given an arrangement of the register units R$i$ in sequence as illustrated in FIG. 1, the respective input data words $x_{in}$, $x'_{in}$ etc. are "passed on" from register unit to register unit. The individual registers must be driven with a delay of $w_{k/2}-1$ internal clock pulses.

Therefore, a coefficient block KB$i$, the input data word $x_{in}$ stored for $w_{k/2}$ internal clock pulses in the register unit R$i$ is, in each case, delayed in succession with one coefficient bit $c_1^1$ with even-numbered significance and by half an internal clock cycle. It is multiplied by a coefficient bit $c_1^0$ with odd-numbered significance in the second multiplier unit M2$i$.

The individual part results are, as illustrated in FIG. 1, each delayed by half an internal clock pulse in each delay unit V1$i$, V2$i$, V3$i$, and "passed on" in accordance with the circuit arrangement as far as the n-th coefficient block KB$n$, where they are then summed in the accumulator register accu to form a result word $w_R$. If the register unit R$i$ has $w_{k/2}-1$ registers, the number of required registers is increased, but the driving of the registers in order to "administer" the input data words $x_{in}$, $x'_{in}$ etc. is easier since, in this case, each input data word $x_{in}$, $x'_{in}$ etc. is written into the register unit R$i$ precisely $w_k$ times in succession and is passed on at each internal clock pulse. The further sequencing of the method described above does not change as a result of the different number of registers which the register unit R$i$ has.

Figure 2:
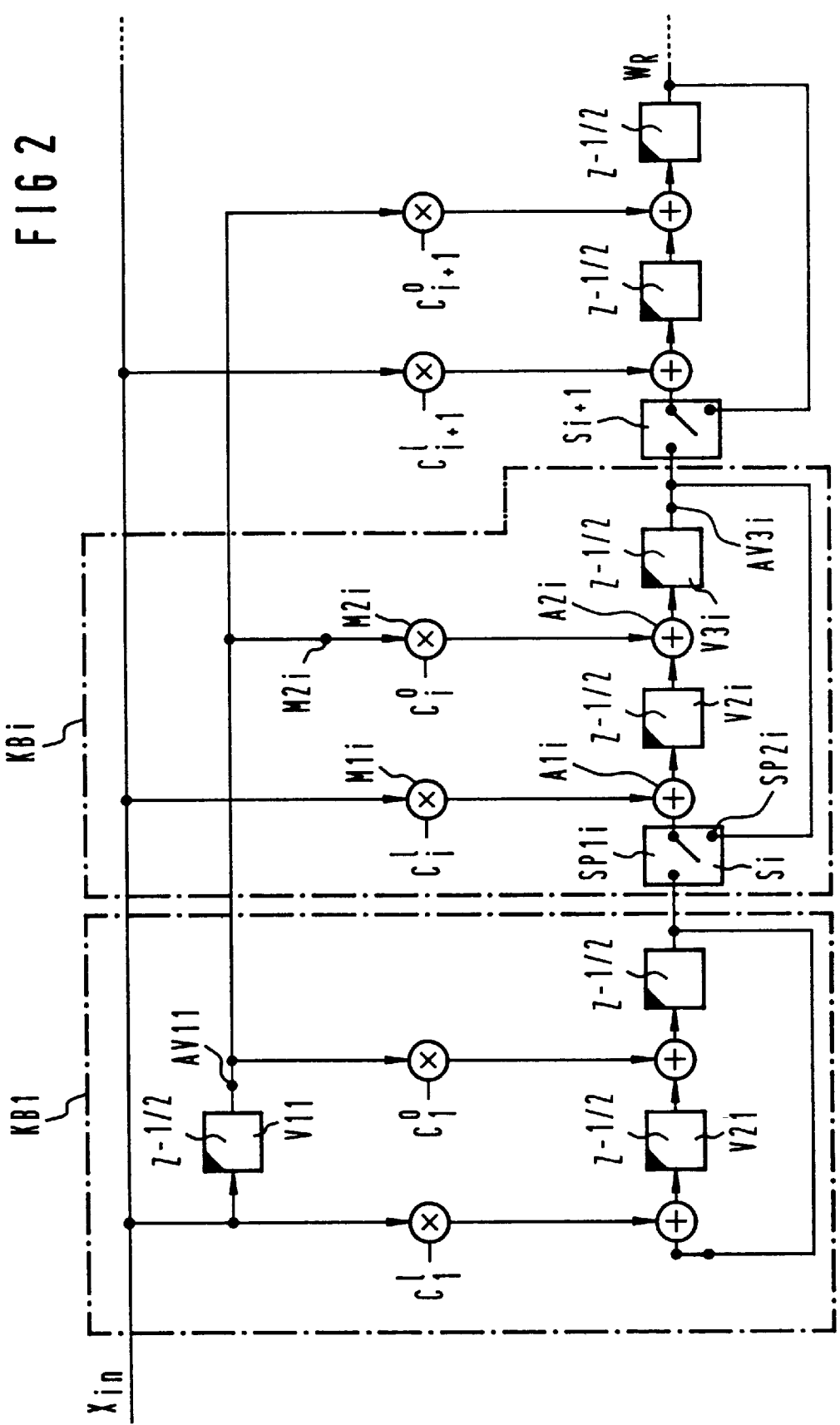
FIG. 2 shows a detail of an alternative circuit of a digital transversal filter which is suitable for multiple use in the direction of the coefficient word length.

A further exemplary embodiment of a circuit for the multiple use of the filter F in the direction of the coefficient word length is illustrated in FIG. 2. The coefficient block KB$i$ differs from the exemplary embodiment illustrated in FIG. 1 to the extent that the first delay unit V11 is provided only for the first coefficient block KB1. For the rest of the coefficient blocks KB$i$, $i \neq 1$; in each case the first input E1M2$i$ of the second multiplier unit M2$i$ is connected to the output AV11 of the first delay unit V11 of the first coefficient block KB1.

Further, first delay units V1$i$ are not provided in this exemplary embodiment and no register units R$i$ are provided.

For this reason, a coefficient-block-internal feedback is provided in each coefficient block KB$i$. This means that there is provision of an additional switch unit S$i$ which has a first switch position SP1$i$ and a second switch position SP2$i$.

In a first switch position SP1$i$, the i-th coefficient block KB$i$, to be more precise the second input E2A1$i$ of the first adder unit A1$i$ of the i-th coefficient block KB$i$, is connected to the output AV3$i-1$ of the third delay unit V3$i-1$ of a preceding coefficient block KB$i-1$. In the second switch position SP2$i$, the i-th coefficient block KB$i$ is connected to its "own" output AV3$i$ of the third delay unit V3$i$ of the same coefficient block KB$i$.

If the switch unit S$i$ is located for precisely this amount of time in the first switch position SP1$i$, which is required for the multiplication of the entire coefficient $c_i$, (i.e., for the multiplication of all the individual coefficient bits $c_1^1$, $c_1^0$ of the respective coefficient block KB$i$), the "feedback" of a coefficient-block-internal summation of the part results of the multiplications of the respective coefficient bit $c_1^1$, $c_1^0$ corresponds to the input word $x_{in}$.

Since, in this exemplary embodiment, the summation takes place in the individual coefficient blocks KB$i$, it is readily apparent that, in this case, no accumulator register accu is required and hence none is provided.

Figure 3:
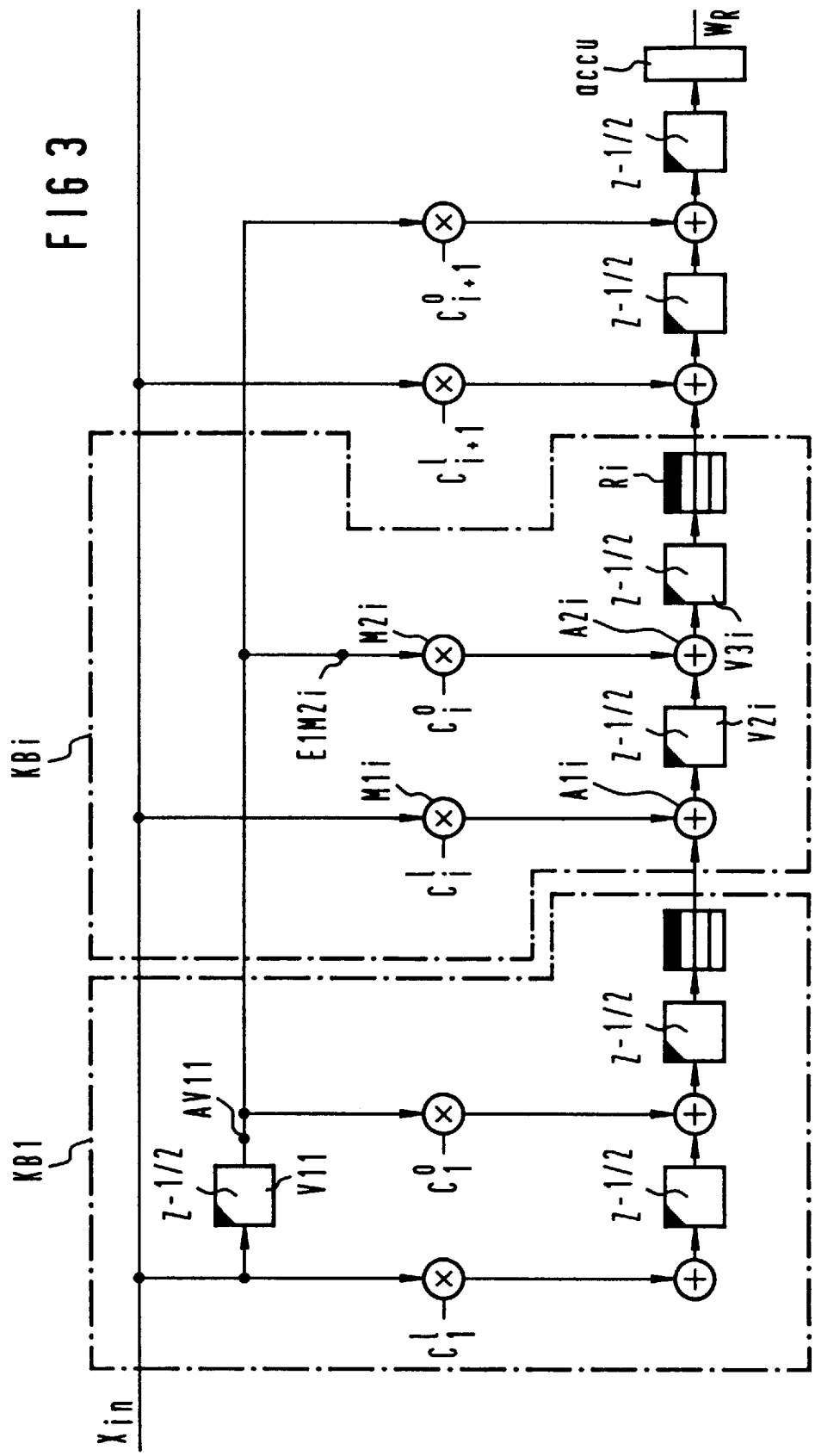
FIG. 3 shows a detail of another alternative circuit of a digital transversal filter which is suitable for multiple use in the direction of the coefficient word length.

In the exemplary embodiment shown in FIG. 3, as with the exemplary embodiment illustrated in FIG. 2, only the first coefficient block KB1 has the first delay unit V11. None of the other coefficient blocks KB$i$, $i \neq 1$, has a first delay unit V1$i$. Rather, in each case, the first inputs E1M2$i$ of the second multiplier unit M2$i$ are connected to the output AV11 of the first delay unit V11 of the first coefficient block KB1. In contrast with the third exemplary embodiment illustrated in FIG. 2, no switch unit S1 is provided since the individual part results are "passed on" again from one coefficient block to another, and are finally summed in the accumulator register accu to form the result word $w_R$.

Register units R$i$ are provided which are, however, connected in each case by their inputs ER$i$ to the outputs AV3$i$ of the third delay units V3$i$, and whose outputs AR$i$ are connected in each case to the second inputs E2A1$i$+1 of the first adder units A1$i$+1 of the respectively following coefficient blocks KB$i$+1. The register units R$i$ have $W_{k/2}-1$ registers.

If a carry-save addition is carried out, twice the number of registers is provided in each register unit R$i$, that is to say $w_k*2$ registers; some for the carry word and some for the sum word. The number of delays does not change in this case. When a carry-save addition is applied, a vector merging adder functionality has to be provided in the accumulator register accu in order to carry out the addition correctly.

The way in which the individual multiplier units are driven using the individual coefficient bits $c_1^1$, $c_1^0$ and the way in which the register units R$i$ are driven is apparent from the statements presented above and from FIG. 3.

Figure 4:
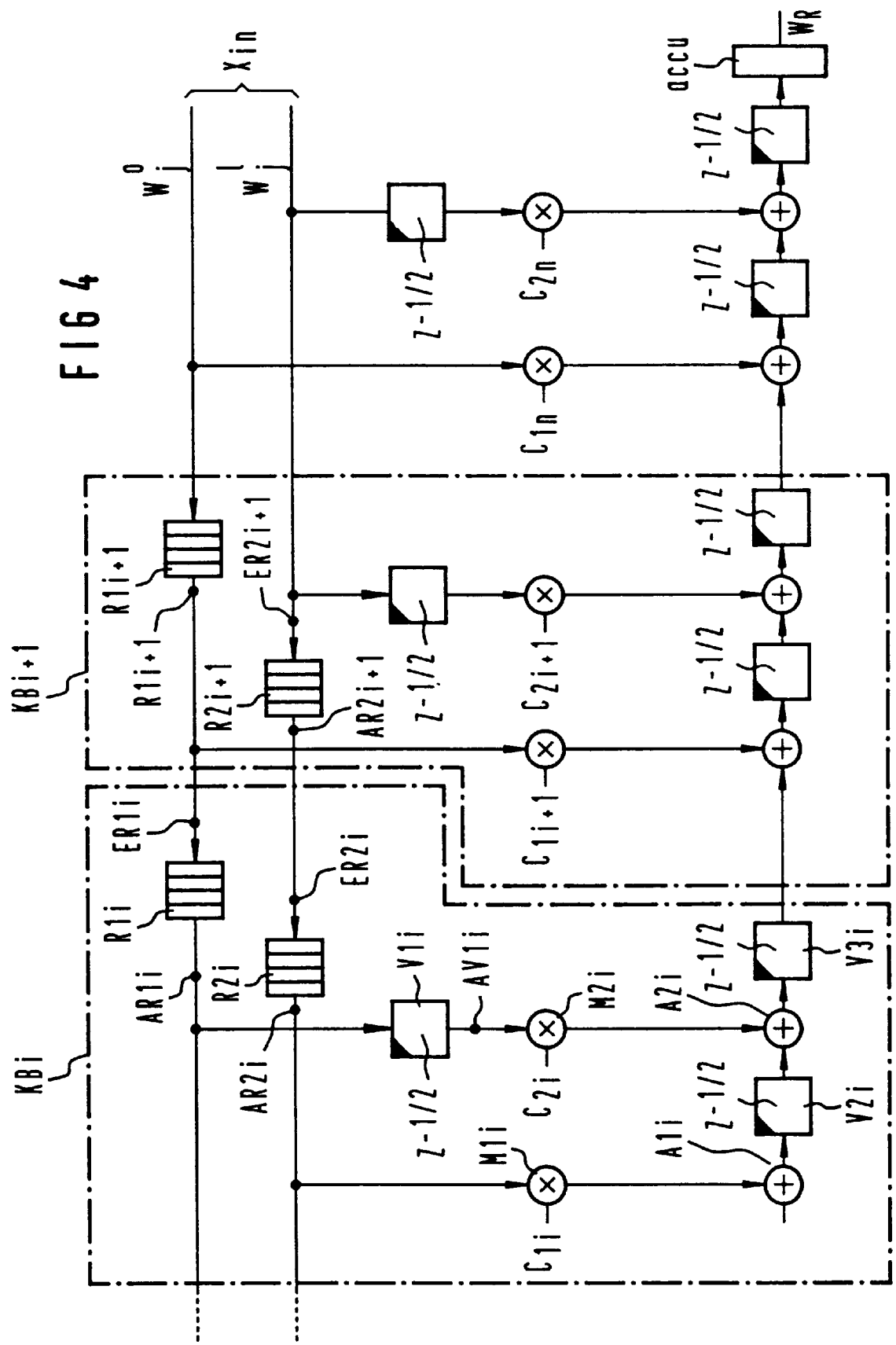
FIG. 4 shows a detail of a circuit of a digital transversal filter which is suitable for multiple use in the direction of the input word length.

FIG. 4 illustrates a circuit arrangement for the multiple use of the filter F in the direction of an input data word length $w_m$ of the input data words $x_{in}$. An index j identifies each input data word bit $w_j$ uniquely and is any desired number in the range from 1 to m, one number m specifying the word length of the input data word $x_{in}$. Instead of the register unit R$i$, a first register unit R1$i$ and a second register unit R2$i$ are provided in this circuit. Here, one output AR1$i$ of the first register unit R$i$ is connected to the input EV1$i$ of the first delay unit V1$i$. An input ER1$i$ of the first register unit R1$i$ is connected to an output AR1$i$+1 of a first register unit R1$i$ of a following coefficient block KB$i$+1. An output AR2$i$ of the second register unit R2$i$ is connected to a first input E1M1$i$ of the first multiplier unit M1$i$. An input ER2$i$ of the second register unit R2$i$ is connected to an output AR2$i$+1 of a second register unit R2$i$ of a following coefficient block KB$i$+1. The first register unit R1$i$ and the second register unit R2$i$ each have $$\frac{w_j}{2} - 1$$

registers with a word length of at least one bit.

In the circuit illustrated in FIG. 4, there is again provided an accumulator register accu which is connected by means of its input Eaccu to the output AV3$n$ of the third delay unit V3$n$ of the n-th coefficient block KB$n$. In this case, the internal clock rate is $$\frac{w_j}{2}$$

times higher than the "required" external clock rate of the filter F.

In each case the entire coefficient $c_1$ of the i-th coefficient block KB$i$ is applied to the second input E2M1$i$ of the first multiplier cell M1$i$ and to the second input E2M2$i$ of the second multiplier cell M2$i$. In this way, in the first multiplier cell M1$i$, the entire coefficient $c_1$ of the i-th coefficient block KB$i$ is multiplied by one input word bit $w_j^0$ with odd-numbered significance. In the second multiplier cell M2$i$, the entire coefficient $c_1$ of the i-th coefficient block KB$i$ is multiplied by one input word bit $w_j^1$ with even-numbered significance.

Figure 5:
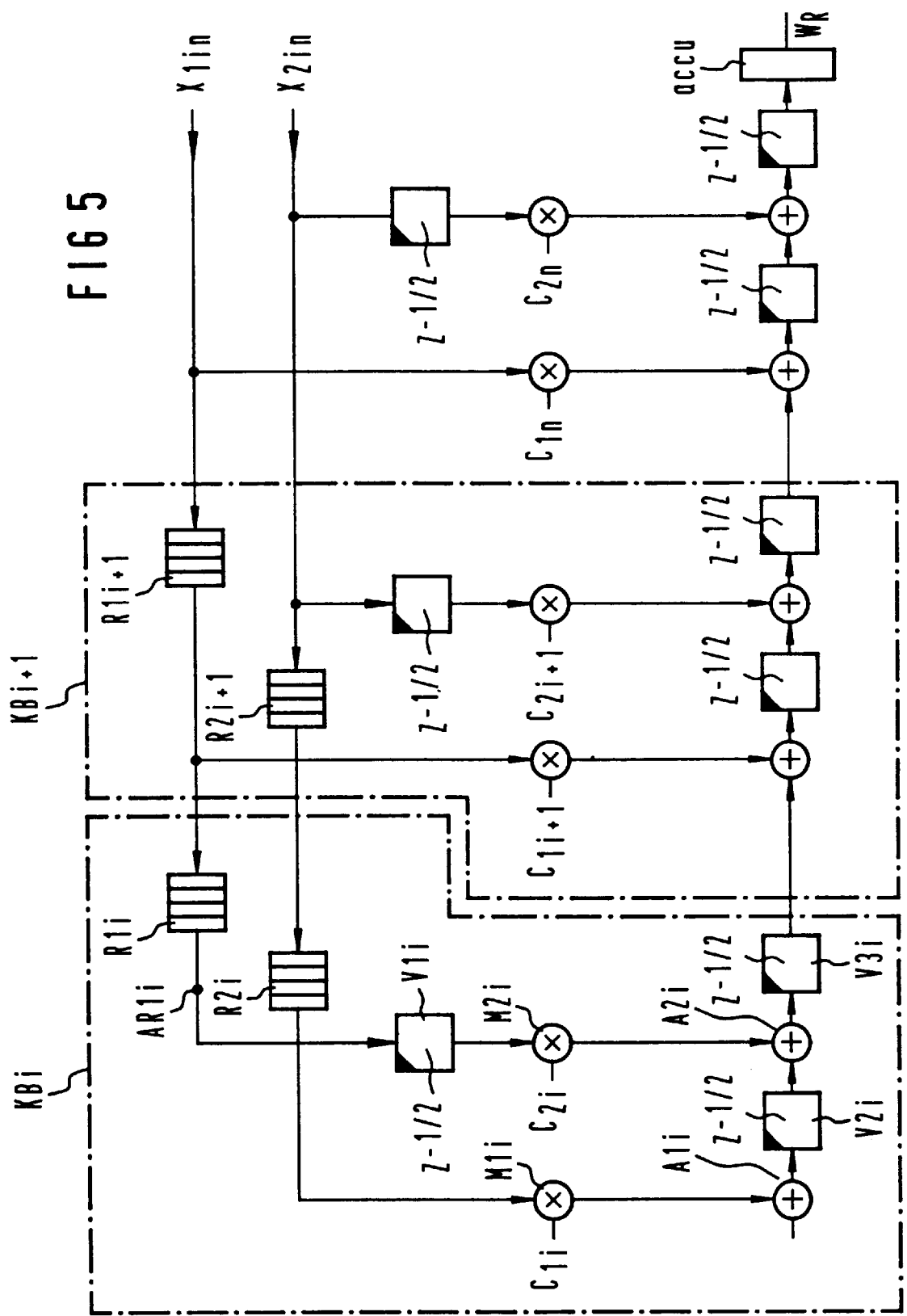
FIG. 5 shows a detail of an alternative circuit of a digital transversal filter which is suitable for multiple use in the direction of the input word length and in which a plurality of suboperations of two subfilters of a complex valued filter are carried out in succession.
Figure 8:
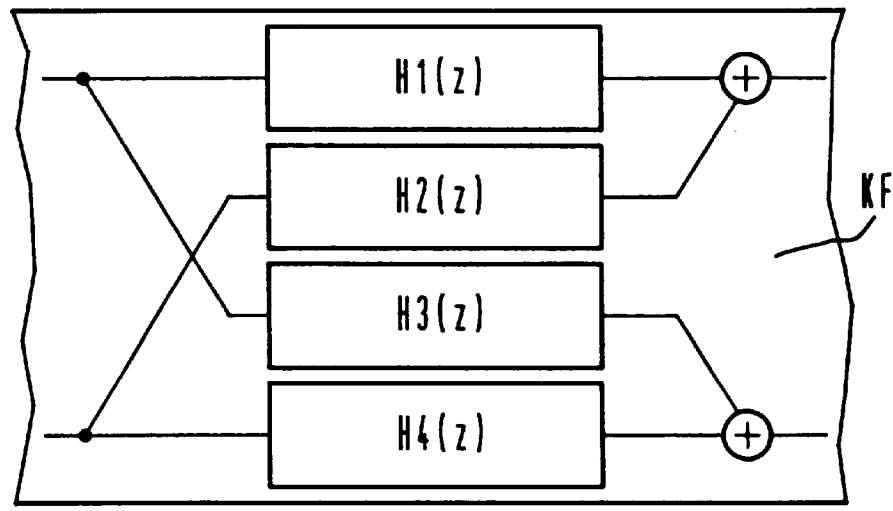
FIG. 8 shows a basic circuit diagram of a complex valued filter.

FIG. 5 illustrates a circuit arrangement of the filter F for the implementation of a complex valued filter, which is illustrated in abstract form in FIG. 8. In this circuit arrangement, in contrast with the circuit arrangement illustrated in FIG. 4, coefficients of subfilter functions Hr(z) described below are applied to the second input E2M1$i$ of the first multiplier cell M1$i$ and to the second input E2M2$i$ of the second multiplier cell M2$i$ for $w_m$ internal clock cycles.

In this case, bits of a first input word $x_{1in}$, which is filtered with a first subfilter function H1(z), are inserted in bit-serial fashion into the first register unit R1$i$. In this way, the individual bits of the first input word $x_{1in}$ are multiplied by the coefficients $c_{1i}$ of the first subfilter function H1(z).

Also in this case, bits of a second input word $x_{2in}$, which is filtered using a second subfilter function H2(z), are inserted in a bit-serial fashion into the second register unit R2$i$. In this way, the individual bits of the second input word $x_{2in}$ are multiplied by the coefficients $c_{2i}$ of the second subfilter function H2(z). Both register units each have $w_m-1$ registers with at least one word length of one bit.

Figure 6:
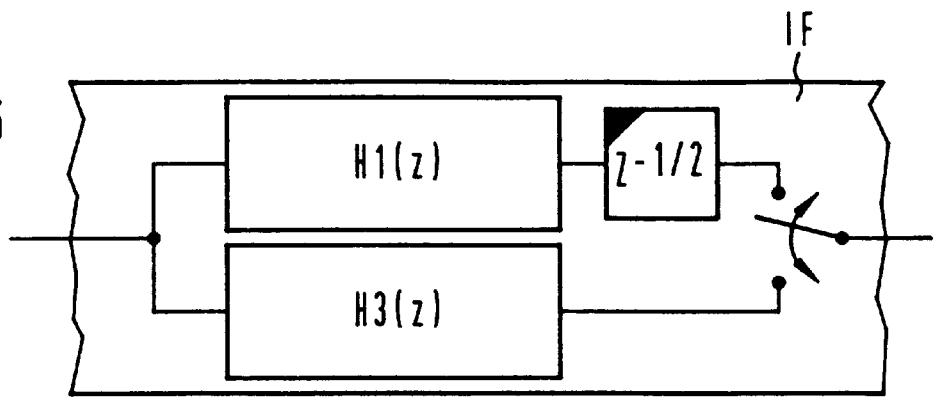
FIG. 6 shows a basic circuit diagram of an interpolation filter in polyphase structure.
Figure 7:
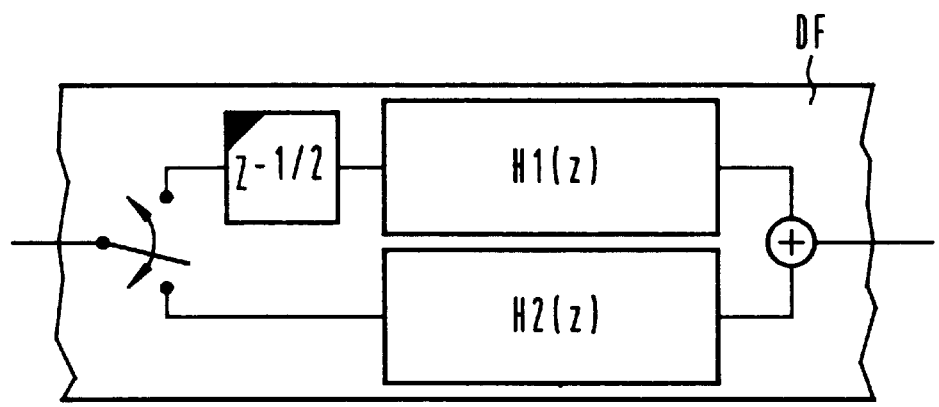
FIG. 7 shows a basic circuit diagram of a decimating filter in polyphase structure.

FIGS. 6 to 8 illustrate different arrangements for using the circuit arrangements according to the present invention not only for the coefficients of a filter function but also for a plurality of different filter functions; i.e., for the coefficients of different subfilter functions Hr(z) wherein the subfilter functions Hr(z) are uniquely identified by an index r which is a natural number in the range from 1 to s. This case occurs if a plurality of transversal filters are implemented together. These may include filter banks, polyphase filters, for example as interpolation filters (cf. FIG. 6) or decimating filters (cf. FIG. 7) or the connecting together of, for example, four filters to form a complex valued filter (cf. FIG. 8).

These possibilities, as illustrated in the figures, for the connecting together of a plurality of transversal filters and for the associated possible multiple uses of the circuit arrangements according to the present invention are, of course, not restricted to the cases which are illustrated in the figures and which relate to the interconnection of only two filter functions. For the person skilled in the art these cases are, as is immediately apparent, capable of being extended to any desired dimensions at any time, in which case, with regard to the expansion. The number of subfilters multiplied by $$\frac{w_k}{2} \text{ is equal to the ratio } \frac{internalclock}{externalclock}$$

The principles for connecting together a plurality of transversal filters are described, for example, in S. Quereshi, Adaptive Equalization, Proc. of the IEEE, Vol. 73, No. 9, pp. 1349 to 1387, 1985.

In such a case, it is possible not only to carry out a plurality of subfilter operations on the same hardware, that is to say with the same circuit arrangement according to the present invention, but also to make use of the fact that two or more subfilter functions Hr(z), which either operate with the same input data or whose results are summed, can be calculated in succession on the same hardware. The method of connecting them together using one delay unit which delays the applied data by half an internal clock cycle is described in FIGS. 4 and 5 and is apparent therefrom.

Figure 9:
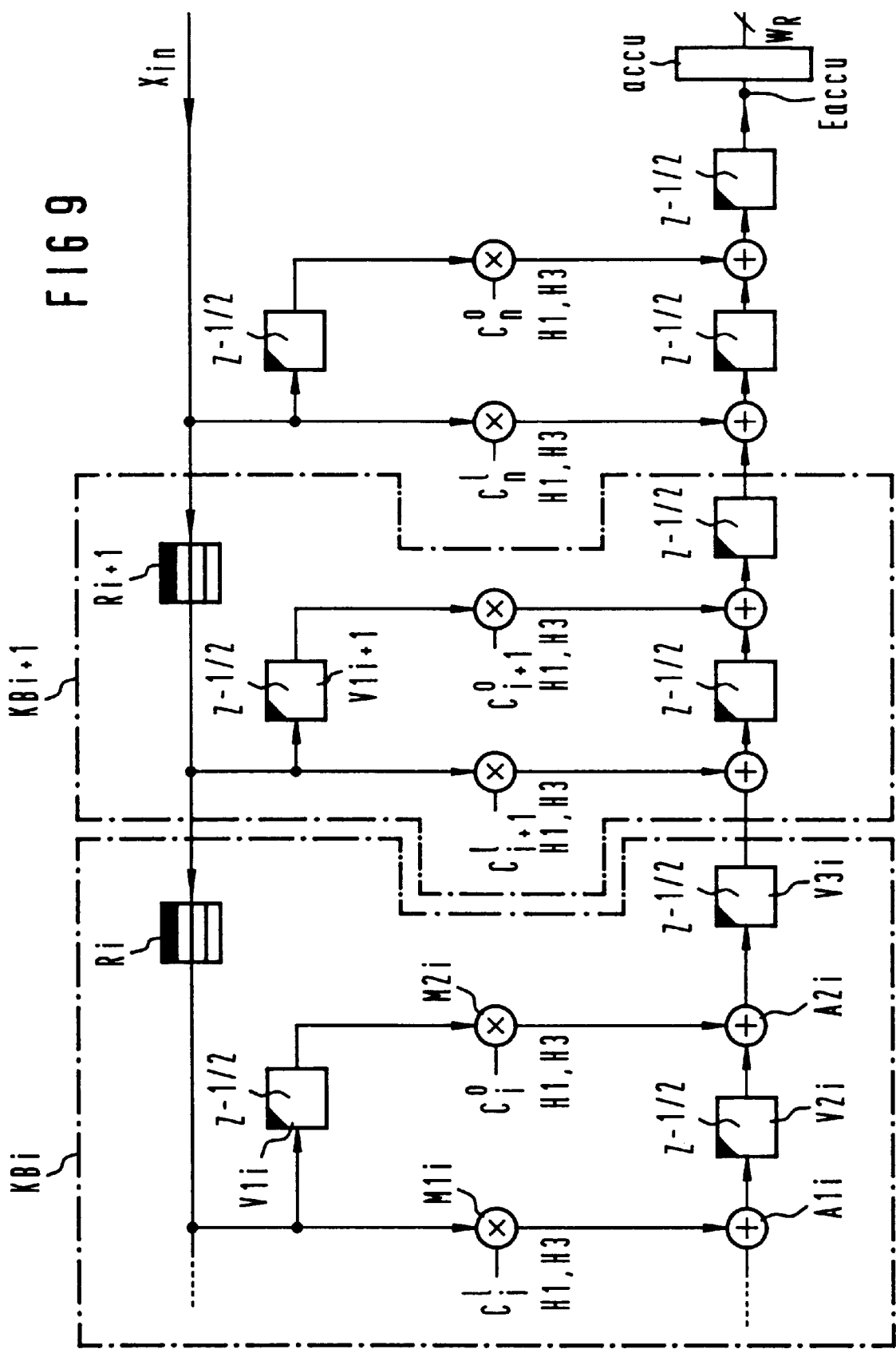
FIG. 9 shows a circuit in which the multiple use of the digital transversal filter relates not only to the individual coefficient bits of the transversal filter but also to the individual subfilters of the entire digital interpolation filter in polyphase structure.
Figure 10:
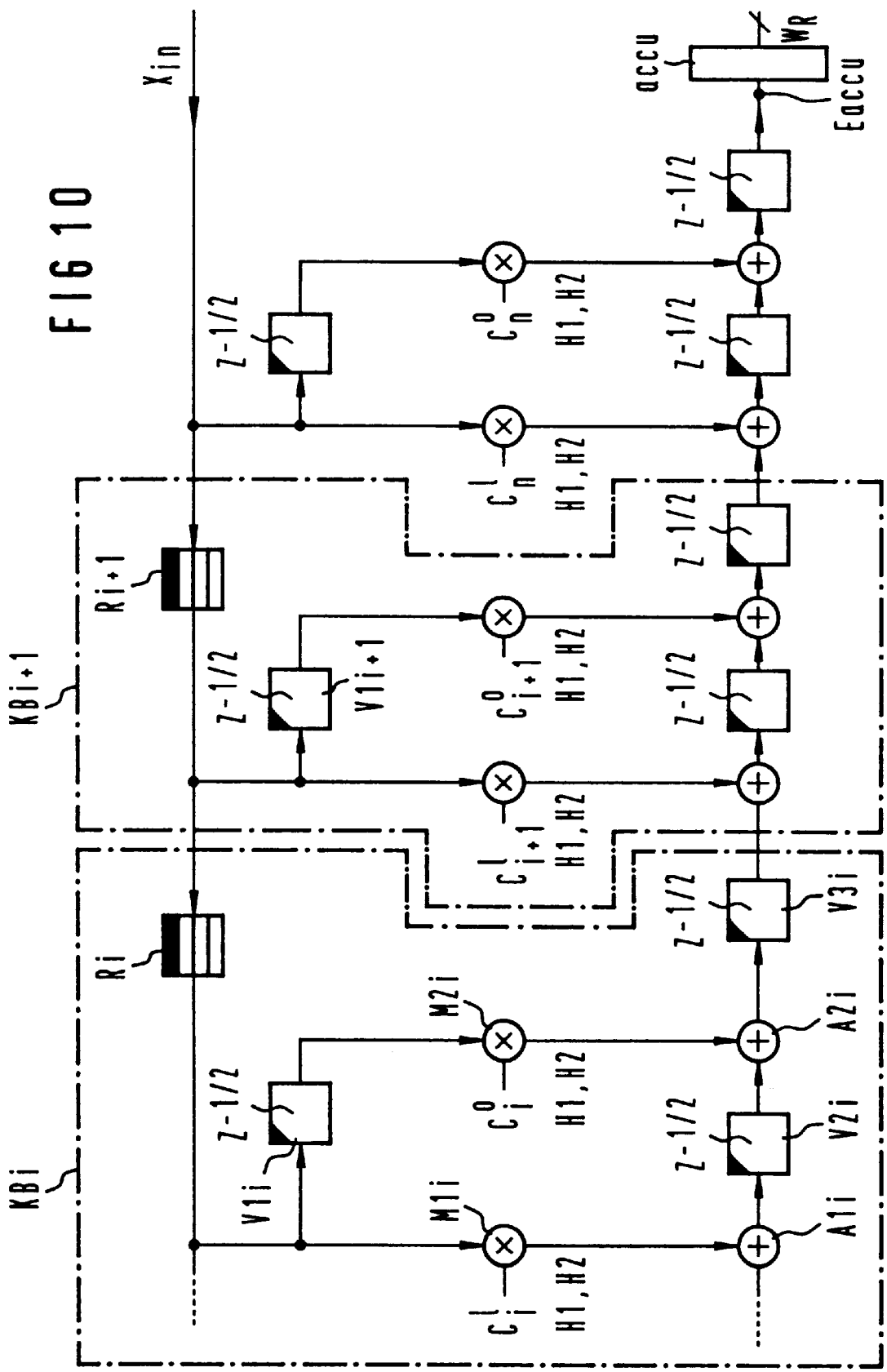
FIG. 10 shows a circuit in which the multiple use is used not only for the individual coefficient bits of the digital transversal filter but also for the subfilters of a composite filter for the implementation of a decimating filter in polyphase structure.

In the case of the circuit arrangement described in FIG. 6, for example, two subfilters H1(Z) and H3(Z) of an interpolation filter in a polyphase structure are calculated in succession in $w_k$ internal clock increments in the circuit arrangement illustrated in FIG. 9. In this case, the driving of the delay units of the inputs must be modified with respect to the circuit arrangement illustrated in FIG. 1 in such a way that data are transferred every $w_k$ internal clock cycles and the transfer of the data from one coefficient block to another is delayed by $w_k-1$ internal clock cycles. The coefficient bits ci are, as previously described, also applied in the sequences of the significances 0, 2, 4, . . . and 1, 3, 5, . . . , but, in this case, firstly for the coefficients of one of the two subfilter transmission functions H1(z) and H3(z), and secondly for the coefficients of the respective other transmission function. The accumulator register accu must continue to sum over $w_{k/2}$ part results and alternately supply one result in each case for each of the subfilters H1(z) and H3(z), respectively, every $w_{k/2}$ internal clock cycles.

In the case of polyphase filters with r subfilters with common data inputs, multiple use factors of $r*w_{k/2}$ can be implemented if the input data are transferred from one coefficient block to the other every $r*w_{k/2}$ internal clock cycles, and at the same time can be delayed by $r*w_{k/2}-1$ internal clock cycles. The accumulator register accu then supplies r part results in succession for each one of the r subfilters Hr(z).

In order to implement a complex valued filter, the two subfilter transmission functions H1(Z) and H3(Z) can be applied in the same way to the architecture described in FIG. 8, as described with regard to the polyphase filter which is illustrated in FIG. 6 and which has two subfilters.

When implementing, for example, two subfilters of a decimating filter in polyphase structure calculated in succession in $w_k$ internal clock cycles, as illustrated in FIG. 7, in comparison with the architecture described in FIG. 1, two registers are provided for the input data per tap instead of a delay register, that is to say instead of the register unit Ri, for the input data. Here, an input word of one of the subfilters is applied in each case for $w_{k/2}$ internal clock cycles and an input word of the other subfilter is applied for $w_{k/2}$ internal clock cycles. The registers transfer data every $w_{k/2}$ internal clock cycles. The transfer of data is delayed from tap to tap by $w_k-1$ internal clock cycles.

In the case of polyphase filters with r subfilters with separate data inputs, multiple use factors of $r*w_{k/2}$ can thus be implemented if the input data are delayed by r registers from tap to tap. Wherein the registers transfer data every $w_{k/2}$ internal clock cycles and the transfer from one coefficient block to another delayed by $r*w_{k/2}-1$ internal clock cycles. Then, depending on the driving, the accumulator register accu either supplies a subresult every $w_{k/2}$ internal clock cycles or supplies the summed part results after $r*w_{k/2}$ internal clock cycles in each case, as is desired in the case of a decimating filter.

Figure 11:
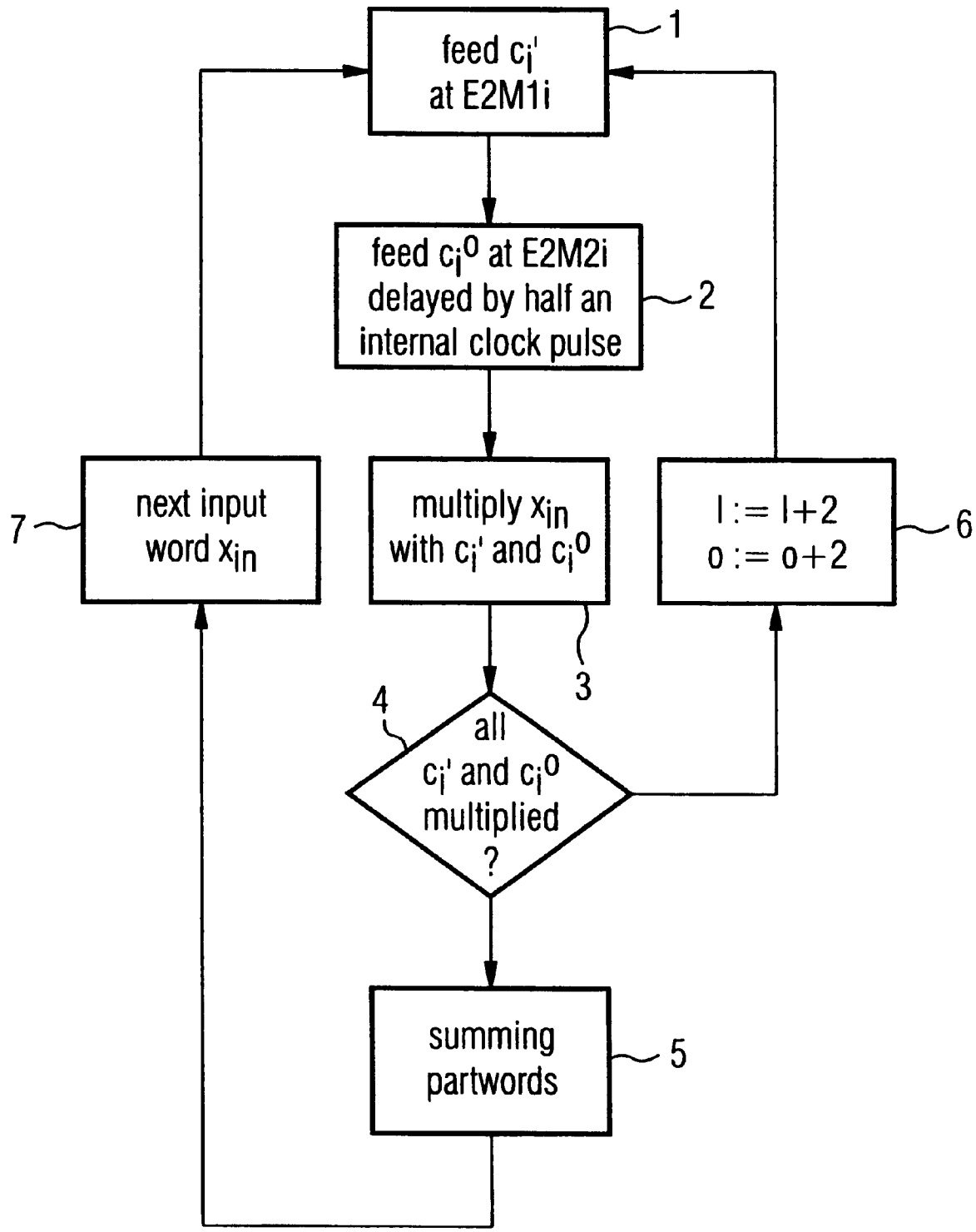
FIG. 11 shows a flowchart which describes the method steps for the multiple use of a digital transversal filter in the direction of the coefficient word length.

In order to implement the complex valued filter in the form illustrated in FIG. 8, it is possible, for example, to apply the two subfilter transmission functions H1(z) and H2(z) in the same way as in the case of the polyphase filter with two subfilters, as illustrated in FIG. 7. The methods for the multiple use of the filter F in coefficient word length have, in each coefficient block KBi, the following method steps which are carried out in parallel in each coefficient block KBi (cf. FIG. 11).

The individual coefficient bits $c_1^1$ and $c_1^0$ are each applied to the second input E2M1i of the first multiplier cell M1i and to the second input E2M2i of the second multiplier cell M2i, respectively, in each case for a duration of one internal clock cycle of the filter F. The applied bits are each multiplied 3 by the input word $x_{in}$. Here, the coefficient bits $c_1^1$ with even-numbered significance are applied 1 to the second input E2M1i of the first multiplier cell M1i. The coefficient bits $c_1^0$ with odd-numbered significance are applied to the second input E2M2i of the second multiplier cell M2i, but delayed by half an internal clock cycle 2, which is achieved by means of the first delay unit Vli.

The multiplications have to be carried out 4, 6 for all the coefficient bits. The partwords produced by the multiplications are summed 5 in a further step taking into account their respective significance. The summation can be carried out 15 in various ways, either individually 16 in each coefficient block KBi (cf. FIG. 2) or at the accumulator register accu 17. After an input word has been completely multiplied, a new input word is processed 7.

FIG. 12 illustrates a flowchart which describes the individual method steps of the method for the multiple use of the filter F in the direction of the input word length. Here, the individual bits $w_j^1$, $w_j^0$ of the input word $x_{in}$ are each multiplied 10 by an "entire" coefficient. For this reason, the individual input word bits $w_j^1$ with even-numbered significance are applied to the input EV1 of the first delay unit V1i where they are delayed by half an internal clock cycle and are then present 8 at the first input E1M2i of the second multiplier cell M2i. The individual input word bits $W_j^0$ with odd-numbered significance are applied 9 directly in each case to the first input E1M1i of the first multiplier unit M1i. This is carried out for all the input word bits $w_j^1, w_j^0$ of the input word $x_{in}$ 11, 13. The partwords which are produced by the multiplications are summed 12. After an input word $x_{in}$ has been completely filtered, the method is carried out 14 again for a further input word.

Although the present invention has been described with reference to specific embodiments, those of skill in the art will recognize that changes may be made thereto without departing from the spirit and scope of the invention as set forth in the hereafter appended claims.

What is claimed is:

1. A circuit of a digital filter, comprising:
   a circuit input to which an input word can be fed;
   n coefficient blocks, each coefficient block further comprising:
      a first multiplier unit;
      a second multiplier unit;
      a first adder unit, a first input of the first adder unit connected to an output of the first multiplier unit;
      a second adder unit, a first input of the second adder unit connected to an output of the second multiplier unit;
      a first delay unit, an input of the first delay unit connected to a first input of the first multiplier unit, and an output of the first delay unit connected to a first input of the second multiplier unit;
      a second delay unit, an input of the second delay unit connected to an output of the first adder unit, and an output of the second delay unit connected to a second input of the second adder unit;
      a third delay unit, an input of the third delay unit connected to an output of the second adder unit, and an output of the third delay unit connected to a second input of a first adder unit of a following coefficient block;
      a second input of the first multiplier unit to which a coefficient bit with even-numbered significance is applied;
      a second input of the second multiplier unit to which a coefficient bit with odd-numbered significance is applied; and
      a register unit, an input of the register unit connected to an output of a register unit of a following coefficient block, and an output of the register unit connected to the first input of the first multiplier unit;
   an accumulator register, an input of the accumulator register connected to the output of the third delay unit of the n-th coefficient block; and
   a circuit output coupled to the accumulator register and from which an output word can be tapped.

2. A circuit as claimed in claim 1, wherein the register unit includes a register which is reloaded after a number of internal clock pulses corresponding to half a coefficient word length.

3. A circuit as claimed in claim 1, wherein the register unit includes a plurality of registers numbering one fewer than half a coefficient word length, each of the plurality of registers being reloaded after each internal clock pulse.

4. A circuit as claimed in claim 1, wherein the input of the first delay unit is connected to the first input of the first multiplier unit of a first coefficient block, and wherein the output of the first delay unit is connected to all first inputs of all second multiplier units.

5. A circuit as claimed in claim 1, wherein the filter is an interpolation filter.

6. A circuit as claimed in claim 1, wherein the filter is a decimating filter.

7. A circuit as claimed in claim 1, wherein the filter is a complex-valued filter.

8. A circuit of a digital filter, comprising:
   a circuit input to which an input word can be fed;
   n coefficient blocks, each coefficient block further comprising:
      a first multiplier unit;
      a second multiplier unit;
      a first adder unit, a first input of the first adder unit connected to an output of the first multiplier unit;
      a second adder unit, a first input of the second adder unit connected to an output of the second multiplier unit;
      a second delay unit, an input of the second delay unit connected to an output of the first adder unit, and an output of the second delay unit connected to a second input of the second adder unit;
      a third delay unit, an input of the third delay unit connected to an output of the second adder unit, and an output of the third delay unit connected to a second input of a first adder unit of a following coefficient block;
      a second input of the first multiplier unit to which a coefficient bit with even-numbered significance is applied; and
      a second input of the second multiplier unit to which a coefficient bit with odd-numbered significance is applied;
   a switch unit having two switch positions, the second input of the first adder unit connected to the output of the third delay unit of a preceding coefficient block in a first switch position, and a second input of the first adder unit connected to the output of the third delay unit in a second switch position;
   a first delay unit, an input of the first delay unit connected to a first input of the first multiplier unit of a first coefficient block, and an output of the first delay unit connected to all first inputs of all second multiplier units; and
   a circuit output coupled to the accumulator register and from which an output word can be tapped.

9. A circuit of a digital filter, comprising:
   a circuit input to which an input word can be fed;
   n coefficient blocks, each coefficient block further comprising:
      a first multiplier unit;
      a second multiplier unit;
      a first adder unit, a first input of the first adder unit connected to an output of the first multiplier unit;
      a second adder unit, a first input of the second adder unit connected to an output of the second multiplier unit;
      a first delay unit, an input of the first delay unit connected to a first input of the first multiplier unit, and an output of the first delay unit connected to a first input of the second multiplier unit;
      a second delay unit, an input of the second delay unit connected to an output of the first adder unit, and an output of the second delay unit connected to a second input of the second adder unit;
      a third delay unit, an input of the third delay unit connected to an output of the second adder unit, and an output of the third delay unit connected to a second input of a first adder unit of a following coefficient block;
      a second input of the second multiplier unit to which a coefficient bit with odd-numbered significance is applied;
      a first register unit, an input of the first register unit connected to an output of a first register unit of a following coefficient block; and
      a second register unit, an input of the second register unit connected to an output of a second register unit of a following coefficient block, and an output of the second register unit connected to a first input of the first multiplier unit;
   an accumulator register, an input of the accumulator register connected to the output of the third delay unit of the n-th coefficient block; and
   a circuit output coupled to the accumulator register and from which an output word can be tapped.

10. The circuit as claimed in claim 9, wherein both the first register unit and the second register unit have a word length of one and a length of $$\frac{w_2}{2} - 1.$$

11. The circuit as claimed in claim 9, wherein the first register unit and the second register unit have a word length of one and a length of $W_m - 1$.

12. A method for the multiple use of a digital filter having a plurality of coefficient blocks, comprising the steps of:
   providing the filter with an external clock;
   providing the filter with an internal clock which is an integral order of magnitude faster than the external clock;
   providing, in each coefficient block, a first multiplier unit;
   providing, in each coefficient block, a second multiplier unit;
   providing, in each coefficient block, a first adder unit, a first input of the first adder unit connected to an output of the first multiplier unit;
   providing, in each coefficient block, a second adder unit, a first input of the second adder unit connected to an output of the second multiplier unit;
   providing, in each coefficient block, a first delay unit, an input of the first delay unit connected to a first input of the first multiplier unit, and an output of the first delay unit connected to a first input of the second multiplier unit;
   providing, in each coefficient block, a second delay unit, an input of the second delay unit connected to an output of the first adder unit, and an output of the second delay unit connected to a second input of the second adder unit;
   providing, in each coefficient block, a third delay unit, an input of the third delay unit connected to an output of the second adder unit, and an output of the third delay unit connected to a second input of a first adder unit of a following coefficient block;

providing, in each coefficient block, a second input of the first multiplier unit to which a coefficient bit with even-numbered significance is applied;

providing, in each coefficient block, a second input of the second multiplier unit to which a coefficient bit with odd-numbered significance is applied;

providing, in each coefficient block, a register unit, an input of the register unit connected to an output of a register unit of a following coefficient block, and an output of the register unit connected to the first input of the first multiplier unit;

providing an accumulator register, an input of the accumulator register connected to the output of the third delay unit of the n-th coefficient block;

providing a circuit output coupled to the accumulator register and from which an output word can be tapped;

applying, in each coefficient block, a coefficient bit with even-numbered significance in a chronological succession for a duration of one internal clock pulse to the second input of the first multiplier unit;

applying, in each coefficient block, a coefficient bit with odd-numbered significance in a chronological succession for the duration of one internal clock pulse and delayed by half an internal clock pulse with respect to the application of the coefficient bit with even-numbered significance to the second input of the second multiplier unit;

multiplying an applied input word by the applied coefficient bits in the first multiplier unit and in the second multiplier unit; and summing partwords which have been produced as a result of the multiplications in accordance with the significance to form a composite word.

13. A method as claimed in claim 12, wherein the summing of the partwords is carried out individually for each coefficient in each coefficient block.

14. A method as claimed in claim 12, wherein the summing of all partwords of all coefficients is carried out in an accumulator register.

15. A method as claimed in claim 12, further comprising the step of:

applying coefficients of a plurality of filter functions to the first and second multiplier units in alternating succession.

16. A method for the multiple use of a digital filter having a plurality of coefficient blocks, comprising the steps of:

providing the filter with an external clock;

providing the filter with an internal clock which is an integral order of magnitude faster than the external clock;

providing, in each coefficient block, a first multiplier unit;

providing, in each coefficient block, a second multiplier unit;

providing, in each coefficient block, a first adder unit, a first input of the first adder unit connected to an output of the first multiplier unit;

providing, in each coefficient block, a second adder unit, a first input of the second adder unit connected to an output of the second multiplier unit;

providing, in each coefficient block, a first delay unit, an input of the first delay unit connected to a first input of the first multiplier unit, and an output of the first delay unit connected to a first input of the second multiplier unit;

providing, in each coefficient block, a second delay unit, an input of the second delay unit connected to an output of the first adder unit, and an output of the second delay unit connected to a second input of the second adder unit;

providing, in each coefficient block, a third delay unit, an input of the third delay unit connected to an output of the second adder unit, and an output of the third delay unit connected to a second input of a first adder unit of a following coefficient block;

providing, in each coefficient block, a second input of the first multiplier unit to which a coefficient bit with even-numbered significance is applied;

providing, in each coefficient block, a second input of the second multiplier unit to which a coefficient bit with odd-numbered significance is applied;

providing, in each coefficient block, a register unit, an input of the register unit connected to an output of a register unit of a following coefficient block, and an output of the register unit connected to the first input of the first multiplier unit;

providing an accumulator register, an input of the accumulator register connected to the output of the third delay unit of the n-th coefficient block;

providing a circuit output coupled to the accumulator register and from which an output word can be tapped;

applying, in each coefficient block, an input word bit with even-numbered significance in a chronological succession for a duration of one internal clock pulse to the input of the first delay unit;

applying, in each coefficient block, an input word bit with odd-numbered significance in a chronological succession for the duration of one internal clock pulse to the first input of the first multiplier unit;

multiplying the coefficient word which is applied to the first input of the first multiplier cell by the coefficient word which is applied to the first input of the second multiplier cell; and summing partwords which have been produced as a result of the multiplications in accordance with the significance in an accumulator register to form a composite word.

* * * * *